United States Patent

Taylor

Patent Number: 5,615,330
Date of Patent: Mar. 25, 1997

[54] RECOVERY METHOD FOR A HIGH AVAILABILITY DATA PROCESSING SYSTEM

[75] Inventor: Richard N. Taylor, Cheshire, Great Britain

[73] Assignee: International Computers Limited, London, England

[21] Appl. No.: 543,798

[22] Filed: Oct. 16, 1995

[30] Foreign Application Priority Data

Nov. 12, 1994 [GB] United Kingdom .................. 9422854

[51] Int. Cl.$^6$ ............................. G01R 31/28; G06F 11/00
[52] U.S. Cl. ...................................... 395/182.05; 364/134
[58] Field of Search ......................... 395/182.05, 182.08, 395/182.04, 182.03, 200.08; 364/134

[56] References Cited

U.S. PATENT DOCUMENTS

| | | | |
|---|---|---|---|
| 4,608,688 | 8/1986 | Hansen | 371/11 |
| 5,142,680 | 8/1992 | Ottman | 395/700 |
| 5,155,845 | 10/1992 | Beal | 395/182.04 |
| 5,241,672 | 8/1993 | Slomcenski | 395/600 |
| 5,257,377 | 10/1993 | Sathi | 395/700 |
| 5,321,826 | 6/1994 | Ushiro | 395/425 |
| 5,430,845 | 7/1995 | Rimmer | 395/275 |
| 5,432,927 | 7/1995 | Grote | 395/182.05 X |
| 5,452,454 | 9/1995 | Basu | 395/700 |
| 5,469,573 | 11/1995 | McGill, III | 395/700 |

*Primary Examiner*—Hoa T. Nguyen
*Assistant Examiner*—Glenn Snyder
*Attorney, Agent, or Firm*—Lee, Mann, Smith, McWilliams, Sweeney & Ohlson

[57] ABSTRACT

A method is described for rapidly recovering a multi-processor data processing system from failure of a boot disk. Each data processing unit in the system has a private boot disk, and at least one shared disk. The processing units are interconnected so that each processing unit has access to its own private boot disk and also to the shared disks in all of the processing units. If the boot disk of one of the processing units fails, the system is temporarily reconfigured to connect a new boot disk in place of the shared disk in that processing unit. Another of the processing units is then operated to copy the contents of its own boot disk to the new boot disk.

6 Claims, 3 Drawing Sheets

RECOVERY METHOD FOR A HIGH AVAILABILITY DATA PROCESSING SYSTEM

BACKGROUND TO THE INVENTION

This invention relates to a recovery method for a high-availability data processing system. The invention also relates to a high-availability data processing system specially adapted for use in such a recovery method. Such systems in general comprise a plurality of processors, arranged so that if one processor fails another processor can take over the workload of the failed processor. In addition, storage media must be duplicated (mirrored) to guard against disk drive failure.

In certain markets for high-availability systems, such as for example the retail market place, the cost of the hardware is a very important consideration. A single enterprise may have large numbers of high availability systems, which means that any incremental cost is multiplied by the number of systems concerned.

As mentioned above, for high-availability operation, storage media are mirrored to guard against disk drive failure. The majority of disks are shared between two processors to allow either processor to support applications located on these disks. However, it is necessary to have at least one disk on each processor which is private to that processor which will allow the operating system to be established, and which in turn will manage the access to the shared disks. This private disk also carries all the unique identity information relating to that processor. In large systems, this private disk can be mirrored locally to a second private disk on the same processor. However, in low cost retail systems, this second private disk imposes an unacceptable cost.

The object of the present invention is to provide a way of solving this problem.

SUMMARY OF THE INVENTION

According to a first aspect of the invention there is provided a recovery method for a data processing system comprising at least first and second data processing units, each of said processing units having a private boot disk and at least one shared disk, said system having an initial configuration in which each of said data processing units is connected to its own private boot disk and is also connected to each said shared disk, the recovery method comprising the steps:

(a) replacing a failed private boot disk in one of said processing units with a new boot disk;

(b) temporarily reconfiguring the system to connect the new boot disk in place of the shared disk in said one of said processing units;

(c) operating the other of said processing units to copy the contents of its own boot disk to the new boot disk; and (d) restoring the initial configuration of said system, but with said new boot disk in place of said failed boot disk.

According to another aspect of the invention, there is provided a data processing system comprising:

(a) at least first and second data processing units;

(b) each of said processing units having a private boot disk, and at least one shared disk;

(c) connection means for connecting each of said processing units to its own private boot disk and also to the shared disks in both of the processing units; and (d) recovery means for temporarily reconfiguring said connection means to connect a new boot disk in place of the shared disk in one of said processing units.

DESCRIPTION OF AN EMBODIMENT OF THE INVENTION

One data processing system and method in accordance with the invention will now be described by way of example with reference to the accompanying drawings.

Figure 1:
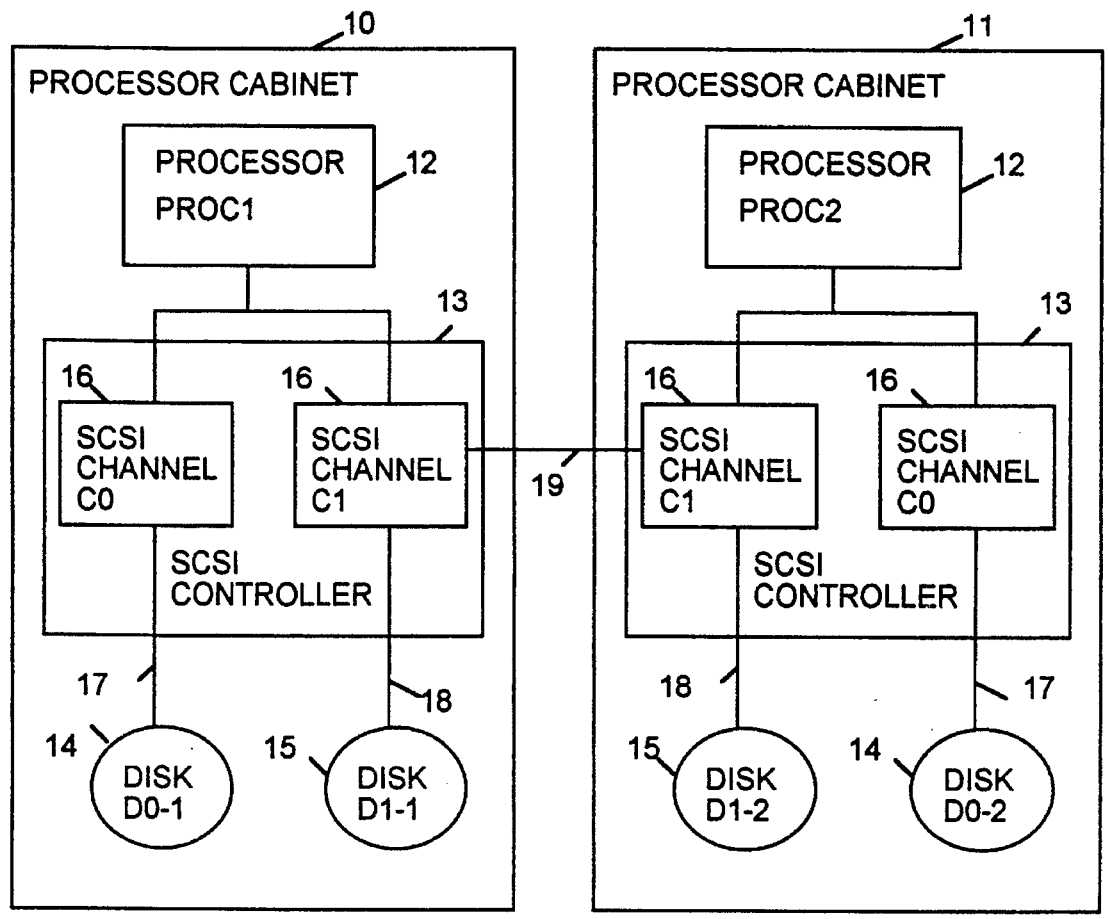
FIG. 1 is a block diagram showing a high-availability dual-processor data processing system.

Referring to FIG. 1, the data processing system comprises two processor cabinets 10 and 11. Each processor cabinet includes a processor 12 (PROC1, PROC2), a two-channel SCSI controller 13, a private boot disk drive 14 (D0-1, D0-2), and a shared disk drive 15 (D1-1, D1-2). Each controller 13 has two channels 16 (C0, C1). The first channel C0 is connected internally, by way of a SCSI ribbon cable 17, to the private boot disk drive D0-1 or D0-2 in the same processor cabinet. The second channel C1 has two connections: an internal connection which is coupled by way of a SCSI ribbon cable 18 to the local shared disk drive 15 (D1-1 or D1-2), and an external connection which is coupled by way of an inter-processor SCSI connection 19 to channel C1 in the other processor cabinet. In this way, each processor can access three disks: its own boot disk D0-1 or D0-2 on channel C0, and both shared disks D1-1 and D1-2 on channel C1. In other embodiments of the invention, each processor may have more than one shared disk drive connected to its channel C1.

It can be seen that the two channels C1 and the shared disk drives D1-1 and D1-2 are all connected to the same SCSI bus. It is therefore necessary to ensure that they all have different SCSI addresses. In the present example, the two channels C1 have SCSI addresses 6 and 7, while the disk drives D1-1, D1-2 have SCSI addresses 1 and 2.

The shared disk drives D1-1 and D1-2 are operated as a mirrored pair, such that loss of one disk through drive failure, or power loss of the host processor, does not prevent the remaining disk, and all the mirrored data, from being used by the remaining processor. The disks D1-1 and D1-2 hold the main user application. If either of the disks D1-1 or D1-2 has to be replaced, then the replacement disk is re-established from the other of those disks.

If the boot disk D0-1 or D0-2 of either processor has to be replaced, normally the new disk would have to be rebuilt from backup and/or from distribution media. This is a slow and cumbersome process, and will also involve either the additional cost of having a suitable exchangeable media backup device permanently attached, or the extra complication of temporarily attaching such a device. The present system eliminates the need for such rebuilds by using the disks D0-1 and D0-2 in the two processors as a form of mirror, as will now be described.

Figure 2:
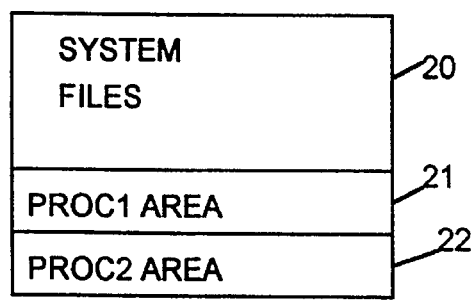
FIG. 2 is a schematic diagram showing data stored on a boot disk within each processor.

Referring to FIG. 2, each of the boot disks D0-1 and D0-2 holds system files 20, common to both the processors. Typically, these system files include the operating system kernel, utilities and networking packages, and occupy around 200 megabytes of storage space. Each of the disks D0-1 and D0-2 also holds two processor-specific areas 21 and 22, one for each of the two processors 12. Each of these areas 21, 22 holds the processor name and network address of the processor in question, as well as other role specific information, and occupies around 1 megabyte.

Figure 3:
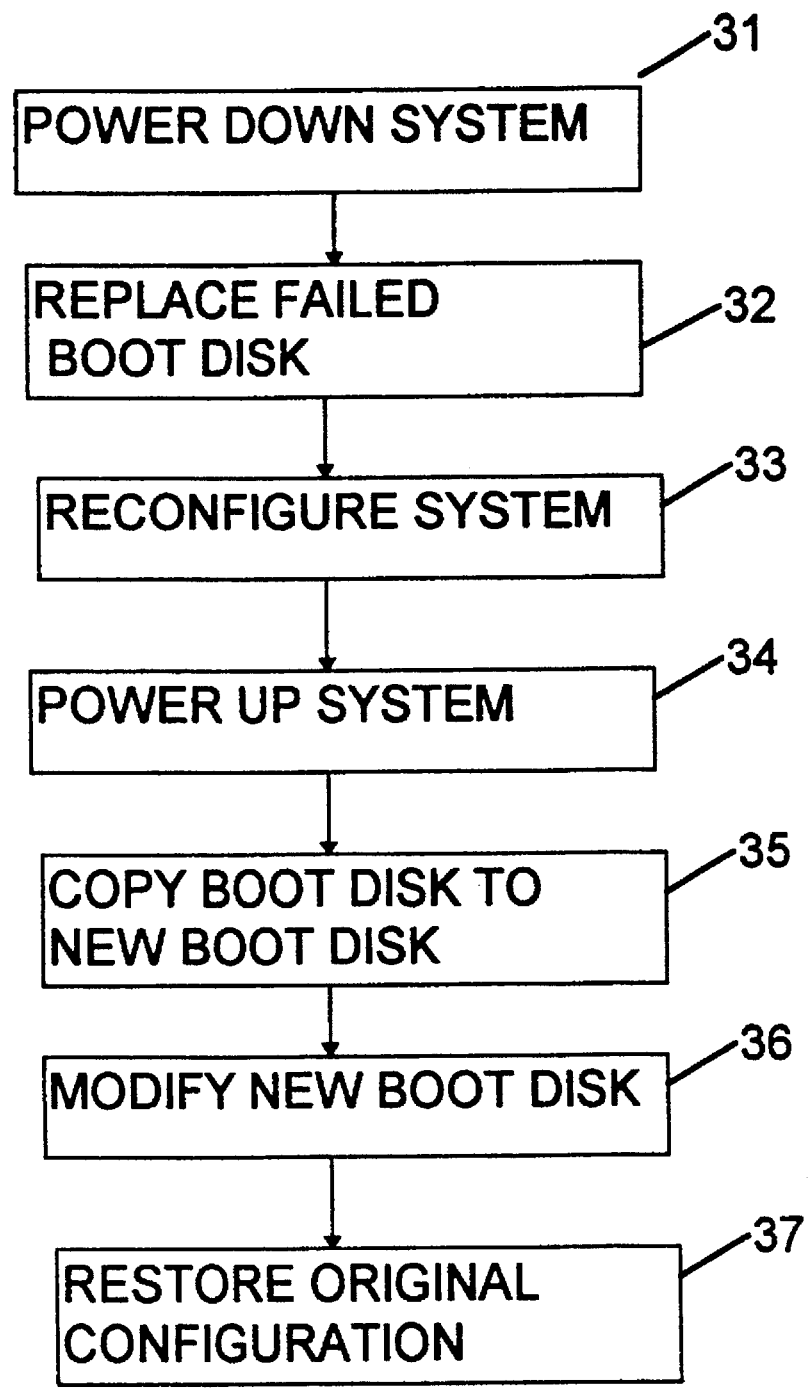
FIG. 3 is a flow chart showing a recovery process which is performed in the event of a boot disk failure.

If the boot disk drive D0-2 belonging to processor PROC2 fails, the following recovery process is performed, as illustrated in FIG. 3.

(Step 31) First, the system is powered down.

(Step 32) The failed disk drive D0-2 is then replaced with a new disk drive. The new disk D0-2 is initially empty.

Figure 4:
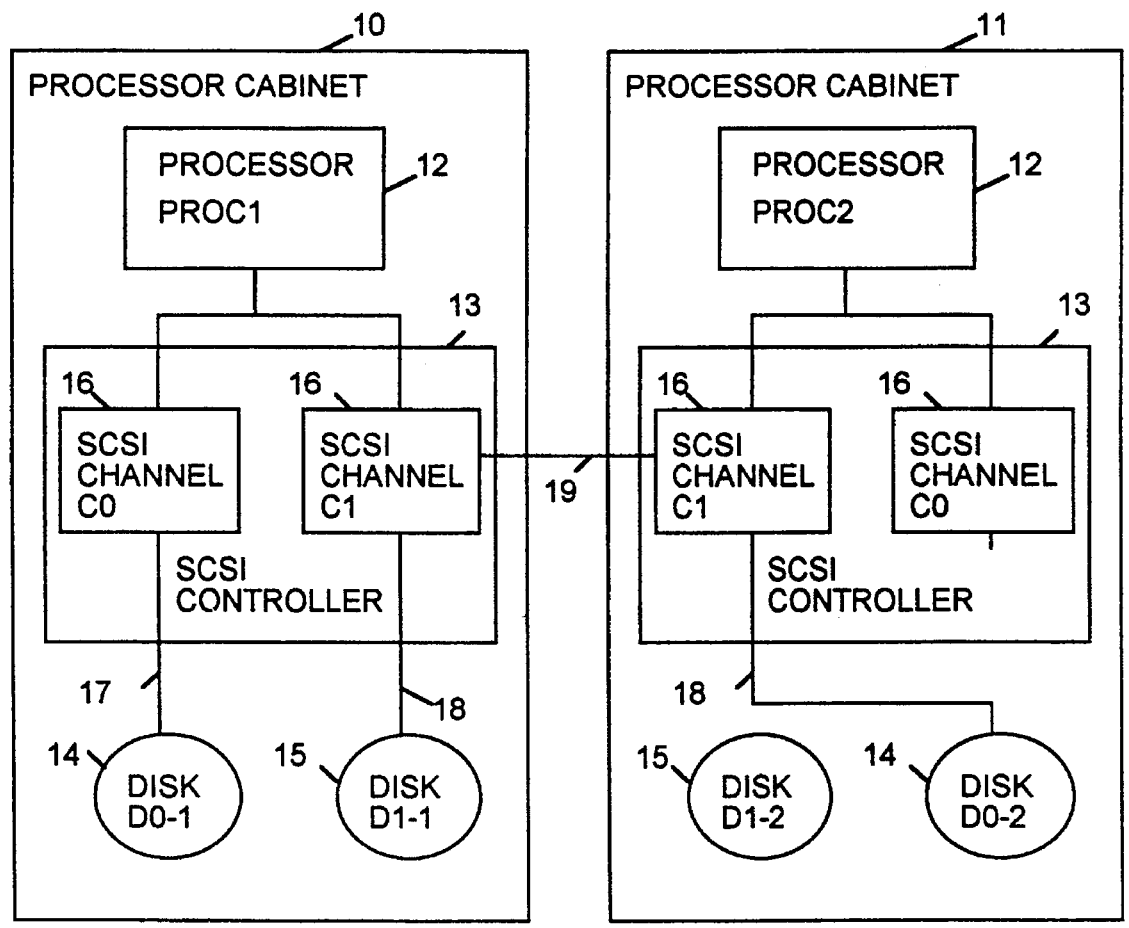
FIG. 4 is a block diagram showing a temporary reconfiguration of the system used in the recovery process.

(Step 33) The system is then temporarily reconfigured by connecting the new disk drive D0-2 to the SCSI channel C1 in place of the local shared disk drive D1-2, as shown in FIG. 4. This reconfiguration may be performed either manually or automatically.

(Step 34) Both processors PROC1 and PROC2 are then powered up. When processor PROC2 powers up, it cannot find any valid boot disk, and so cannot reboot. On the other hand, when processor PROC1 powers up, it finds three disks: its own local boot disk D0-1 on channel C0, disk D1-1 on channel C1, and the new disk D0-2, also on channel C1. Processor PROC1 can therefore now reboot from its local boot disk D0-1.

(Step 35) Processor PROC1 then copies the contents of its local boot disk D0-1 to the new boot disk D0-2, by way of channel C1.

(Step 36) Once this is completed, processor PROC1 accesses the processor-specific information for processor PROC2 from area 22 on its local boot disk D0-1, and uses this information to modify the systems files on the new disk D0-2, so as to make the changes necessary to give processor PROC2 its own unique identity. The copying of the contents of disk D0-1 to disk D0-2, together with the subsequent application of the modifications from area 22, can be performed automatically by processor PROC1.

(Step 37) Finally, processor PROC2 is reconfigured back to the channel connections as shown in FIG. 1, and is rebooted from its new local boot disk D0-2. The recovery process is now complete.

It should be noted that if the boot disk drive D0-1 belonging to processor PROC1 fails, the roles of the processors in the recovery process are reversed: the disk D0-1 is replaced, the system is temporarily reconfigured by connecting the new disk drive D0-1 to channel C1 in processor cabinet 10, in place of disk D1-1, and processor PROC2 then reconstructs the new boot disk for PROC1.

It has been found that typically the above recovery process takes only about 20 to 30 minutes to complete, whereas the conventional rebuild process may take around 3 hours. Thus, the present invention leads to a significant saving in recovery time and the cost of suitable exchangeable mechanisms for restoring from backup or distribution media.

I claim:

1. A recovery method for a data processing system comprising a first data processing unit, a second data processing unit, a first boot disk, a second boot disk, and a plurality of shared disks, said system having a normal configuration in which said first boot disk is accessible only from said first processing unit, said second boot disk is accessible only from said second processing unit, and said shared disks are accessible from both said first data processing unit and said second data processing unit, the recovery method comprising the steps:
(a) upon failure of said second boot disk, removing said second boot disk from the system;
(b) temporarily reconfiguring the system into a recovery configuration in which a new boot disk is connected in place of one of said shared disks;
(c) while the system is in said recovery configuration, operating said first processing unit to copy information from said first boot disk to said new boot disk; and
(d) restoring the normal configuration of said system, with said new boot disk in place of said second boot disk.

2. A recovery method according to claim 1 including a further step of operating said first processing unit to modify said new boot disk, using processor-specific information stored in said first boot disk and specific to said second processing unit.

3. A method according to claim 1 wherein the system is powered down prior to removing said second boot disk, and then powered up again following said temporary reconfiguration of the system.

4. A data processing system comprising:
(a) a first data processing unit and a second data processing unit;
(b) a first boot disk, a second boot disk and a plurality of shared disks;
(c) means for configuring the system in a normal configuration in which said first boot disk is accessible only from said first processing unit, said second boot disk is accessible only from said second processing unit, and said shared disks are accessible from both said first data processing unit and said second data processing unit;
(d) means for temporarily reconfiguring the system, upon failure of said second boot disk, into a recovery configuration in which said second boot disk is removed from the system and a new boot disk is connected in place of one of said shared disks;
(f) means for copying information from said first boot disk to said new boot disk while said system is in said recovery configuration; and
(g) means for restoring the normal configuration of said system, with said new boot disk in place of said second boot disk.

5. A data processing system according to claim 4 wherein said configuring means comprises a SCSI controller in each of said processing units, each said SCSI controller having a first channel connected to one of said boot disks, and a second channel connected to said shared disks.

6. A data processing system according to claim 4 wherein each of said boot disks holds a plurality of system files common to both of said data processing units, as well as a plurality of processor-specific areas of data, one for each of said data processing units.

* * * * *